United States Patent
Nagata

(10) Patent No.: US 8,575,904 B2
(45) Date of Patent: Nov. 5, 2013

(54) SEMICONDUCTOR DEVICE AND MANUFACTURING METHOD THEREOF

(75) Inventor: Toshihisa Nagata, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/811,897

(22) PCT Filed: Dec. 25, 2008

(86) PCT No.: PCT/JP2008/073953
§ 371 (c)(1),
(2), (4) Date: Jul. 7, 2010

(87) PCT Pub. No.: WO2009/087950
PCT Pub. Date: Jul. 16, 2009

(65) Prior Publication Data
US 2010/0277150 A1    Nov. 4, 2010

(30) Foreign Application Priority Data
Jan. 11, 2008 (JP) ................................ 2008-004146

(51) Int. Cl.
*G05F 1/00* (2006.01)

(52) U.S. Cl.
USPC ........................................................ 323/274

(58) Field of Classification Search
USPC .................. 323/282–286, 234, 265, 273–275
See application file for complete search history.

(56) References Cited

U.S. PATENT DOCUMENTS

| 5,177,375 A * | 1/1993 | Ogawa et al. ................. 327/143 |
| 5,619,462 A * | 4/1997 | McClure ....................... 365/201 |
| 6,225,836 B1 * | 5/2001 | Kitade ............................ 327/80 |
| 6,236,194 B1 | 5/2001 | Manabe et al. |
| 6,518,823 B1 | 2/2003 | Kawai |
| 7,170,179 B1 * | 1/2007 | Shah ............................. 257/773 |
| 7,679,346 B2 * | 3/2010 | Lin et al. ....................... 323/282 |
| 2002/0026287 A1 * | 2/2002 | Mizuno et al. ................. 702/64 |
| 2002/0053943 A1 * | 5/2002 | Yamasaki et al. ............. 327/538 |
| 2005/0057238 A1 * | 3/2005 | Yoshida ........................ 323/282 |

(Continued)

FOREIGN PATENT DOCUMENTS

| CN | 1848435 A | 10/2006 |
| JP | 2000-150799 | 5/2000 |

(Continued)

OTHER PUBLICATIONS

International Search Report in PCT/JP2008/073953.

(Continued)

*Primary Examiner* — Adolf Berhane
*Assistant Examiner* — Jeffrey Gblende
(74) *Attorney, Agent, or Firm* — Cooper & Dunham LLP

(57) ABSTRACT

A semiconductor device is disclosed. The semiconductor device includes a switching signal generating circuit formed of a PMOS transistor, a resistor, and inverters which outputs an internal switching signal for switching an operating mode between a first operating mode and a second operating mode when an operating state satisfies a predetermined condition, a mode selection pad to which an external switching signal capable of selecting the first operating mode is input in priority to the internal switching signal, and a switching circuit formed of an OR circuit which switches the operating mode between the first operating mode and the second operating mode based on the external switching signal or the internal switching signal. An output from the switching signal generating circuit is input to the mode selection pad via a trimming fuse.

12 Claims, 3 Drawing Sheets

(56) References Cited

U.S. PATENT DOCUMENTS

| | | |
|---|---|---|
| 2006/0039206 A1 | 2/2006 | Taniguchi et al. |
| 2007/0081400 A1* | 4/2007 | Kim .............................. 365/191 |
| 2008/0150436 A1* | 6/2008 | Suzuki ........................ 315/169.3 |

FOREIGN PATENT DOCUMENTS

| | | |
|---|---|---|
| JP | 2001-51735 | 2/2001 |
| JP | 2001-117650 | 4/2001 |
| JP | 2001-142783 | 5/2001 |
| JP | 2002-168914 | 6/2002 |
| JP | 2002-223155 | 8/2002 |
| JP | 2002-287833 | 10/2002 |
| JP | 2003-249562 | 9/2003 |
| JP | 2003-330550 | 11/2003 |
| JP | 2004-213697 | 7/2004 |
| JP | 2006-59910 | 3/2006 |
| JP | 2006-313797 | 11/2006 |
| JP | 2008-125349 | 5/2008 |

OTHER PUBLICATIONS

Chinese official action (and translation thereof) dated Jul. 3, 2012 in corresponding Chinese patent application No. 200880124315.X.

* cited by examiner

SEMICONDUCTOR DEVICE AND MANUFACTURING METHOD THEREOF

TECHNICAL FIELD

The present invention generally relates to a semiconductor device and a manufacturing method of the semiconductor device in which specifications of the semiconductor device can be accurately determined and testing accuracy of the semiconductor device can be increased.

BACKGROUND ART

When an internal circuit of a semiconductor device is tested, pads and/or external terminals for inputting signals which are required for testing the semiconductor device must be provided in the semiconductor device. However, when the number of the pads is increased, the chip area of the semiconductor device is increased, in addition, when the number of the external terminals is further increased, in some cases, the package of the semiconductor device must be large, and these greatly influence the cost and the size of a product including the semiconductor device. That is, the number of the pads and the number of the external terminals for the signals which are used for only testing the semiconductor device are desired to be as small as possible.

Therefore, when signals of an internal circuit not directly connected to the pads and the external terminals need to be tested, signals output from existing pads and terminals are obtained instead, and states of the signals of the internal circuit have been estimated.

For example, in a constant voltage circuit shown in FIG. 3, an operating mode is switched between a normal operating mode and an energy saving operating mode based on an output current Io.

As shown in FIG. 3, the constant voltage circuit provides a first error amplifying circuit 11 which is always operated and a second error amplifying circuit 12 which is operated at only the normal operating mode.

The first error amplifying circuit 11 is an amplifying circuit whose response speed is slow but consumption current is small, and the second error amplifying circuit 12 is an amplifying circuit whose response speed is fast but consumption current is great. Input terminals of the first and second error amplifying circuits 11 and 12 are connected to each other, and output terminals of the first and second error amplifying circuits 11 and 12 are connected to each other. In the first and second error amplifying circuits 11 and 12, a reference voltage Vref is applied to inverting input terminals, a voltage Vfb in which an output voltage Vo is divided by resistors R11 and R12 is applied to non-inverting input terminals, and the output terminals are connected to the gate of an output transistor M11.

The second error amplifying circuit 12 further provides a control input terminal. The second error amplifying circuit 12 provides a built-in switching circuit which switches its own operating mode, and the switching circuit controls the operating mode of the second error amplifying circuit 12 corresponding to a signal applied to the control input terminal.

An output from an OR circuit 13 is input to the control input terminal. When a signal input to the control input terminal is a low level, the second error amplifying circuit 12 stops operating, and the consumption current becomes substantially a 0 ampere. In addition, when a signal input to the control input terminal is a high level, the second error amplifying circuit 12 operates, and the consumption current becomes substantially a normal value.

A first input terminal of the OR circuit 13 is connected to a mode selection pad MODE and also connected to ground potential via a resistor R14. Therefore, when a signal is not applied to the mode selection pad MODE, the OR circuit 13 is in a low level. In addition, a second input terminal of the OR circuit 13 is connected to an output terminal of an inverter 15.

A switching signal generating circuit is formed of a PMOS transistor M12, a resistor R13, and inverters 14 and 15.

A current mirror circuit is formed of the PMOS transistor M12 and the output transistor M11. The output current Io is detected as a drain current Id12 of the PMOS transistor M12, and the resistor R13 connected between the drain of the PMOS transistor M12 and ground potential converts the drain current Id12 into a voltage.

When the converted voltage is less than a threshold voltage of the inverter 14, an output from the inverter 14 becomes a high level and an output from the inverter 15 becomes a low level, and an input to the second input terminal of the OR circuit 13 becomes a low level. When no signal is input to the mode selection pad MODE, a signal input to the first input terminal of the OR circuit 13 is the low level; therefore, an output from the OR circuit 13 is a low level, and a signal input to the control input terminal of the second error amplifying circuit 12 becomes a low level. Then, the second error amplifying circuit 12 stops operating and enters the energy saving operating mode.

When the converted voltage is the threshold voltage of the inverter 14 or more, the output from the inverter 15 becomes a high level, and a signal input to the control input terminal of the second error amplifying circuit 12 becomes a high level via the OR circuit 13; therefore, the second error amplifying circuit 12 is operated and enters the normal operating mode.

Since the voltage input to the inverter 14 is a hysteresis voltage, the threshold voltage when the energy saving operating mode is switched to the normal operating mode is determined to be higher than the threshold voltage when the normal operating mode is switched to the energy saving operating mode. With this, jitter at switching the operating modes is prevented.

In addition, in the constant voltage circuit, when a signal of a high level is input to the mode selection pad MODE, an output from the OR circuit 13 is always a high level; therefore, the second error amplifying circuit 12 enters the normal operating mode regardless of the output from the inverter 15.

The output current Io is shown in Equation (1) when the operating mode is switched by the switching signal generating circuit.

$$Io = Vth/(K \times R13) \quad (1)$$

Where, Vth is a threshold voltage of the inverter 14, "K" is a mirror ratio (Id12/Io) between the PMOS transistor M12 and the output transistor M11, and R13 is a resistance value of the resistor R13.

The values of the Vth, K, and R13 in Equation (1) are dispersed while the semiconductor device is manufactured, respectively; therefore, in order to accurately determine the value of the output current Io when the operating mode is switched, the resistance value R13 in Equation (1) is adjusted by trimming. Specifically, the output current Io is measured when the operating mode is switched while the output current Io is increased or decreased, and the trimming amount of the resistor R13 is calculated from the measured output current Io.

However, an output from the inverter 15 which outputs an internal switching signal for switching the operating mode is not connected to a pad and/or an external terminal. Therefore, in order to obtain whether the operating mode is switched, a slight increase of a consumption current of a semiconductor device is detected by the operations of the second error amplifying circuit 12. However, the increase of the consumption current is a very small amount of the total consumption current; therefore, it is difficult to measure the output current Io when the operating mode is switched, and a high-cost testing instrument whose accuracy is high is required.

When a pad and/or an external terminal for only obtaining an internal switching signal output from the inverter 15 is provided, since the switching of the operating mode can be extracted as a logic level signal and can be tested, the output current Io at switching the operating mode can be accurately measured with the use of a low-cost instrument. However, as described above, since the internal switching signal is used only during the test, the pad and/or the external terminal for only the test undesirably influences the cost and the size of the product.

In order to solve the above problem, conventionally, a decrease of the number of testing terminals has been tried. For example, in a method of Patent Document 1, a signal of an internal circuit of a semiconductor device is output to a pad to which an output of a first circuit is connected, and an output from a second circuit whose output is to be tested is connected to the pad via a fuse. During the test of the second circuit, the output from the first circuit is made to be high impedance, and when the test of the second circuit is completed, the fuse is cut off.

[Patent Document 1] Japanese Unexamined Patent Publication No. 2006-313797

However, in patent Document 1, only when the first circuit and the second circuit are not operated at the same time and the output from the first circuit can be made to be the high impedance during the operation of the second circuit, the method can be operated.

SUMMARY

In an aspect of this disclosure, there is provided a semiconductor device to which an internal switching signal and an external switching signal are input and a manufacturing method of the semiconductor device in which mode switching conditions can be accurately determined by detecting operations of the internal switching signal.

In another aspect, there is provided a semiconductor device having a first operating mode and a second operating mode. The semiconductor device includes a switching signal generating circuit which outputs an internal switching signal for switching an operating mode between the first operating mode and the second operating mode when an operating state satisfies a predetermined condition, a mode selection pad to which an external switching signal capable of selecting the first operating mode is input in priority to the internal switching signal, and a switching circuit which switches the operating mode between the first operating mode and the second operating mode based on the external switching signal or the internal switching signal. An output from the switching signal generating circuit is input to the mode selection pad via a trimming fuse.

In yet another aspect, there is provided a manufacturing method of a semiconductor device having a first operating mode and a second operating mode. The semiconductor device includes a switching signal generating circuit which outputs an internal switching signal for switching an operating mode between the first operating mode and the second operating mode when an operating state satisfies a predetermined condition, a mode selection pad to which an external switching signal capable of selecting the first operating mode is input in priority to the internal switching signal, and a switching circuit which switches the operating mode between the first operating mode and the second operating mode based on the external switching signal or the internal switching signal. An output from the switching signal generating circuit is input to the mode selection pad via a trimming fuse. The manufacturing method tests a state of the internal switching signal at the mode selection pad.

In another aspect, switching between a normal operating mode and an energy saving operating mode can be tested as a signal of a logic level from a mode selection pad. Therefore, a value of an output current can be accurately measured when the operating mode is switched. Consequently, a resistance value of a resistor for determining a current can be accurately determined by trimming, and the value of the output current when the operating mode is switched can be accurately determined. Further, since a low-cost testing instrument can be used, the cost in manufacturing processes can be reduced.

In addition, in a semiconductor device including a switching regulator circuit having a PWM operating mode and a PFM operating mode, a current value of an output current can be accurately measured when the operating mode is switched, and a voltage value of a current determining voltage source can be accurately changed by trimming, and the value of the output current can be accurately determined when the operating mode is switched.

The aforementioned and other aspects, features and advantages would be better understood from the following detailed description of a preferred embodiment with reference to the accompanying drawings.

BEST MODE FOR CARRYING OUT THE INVENTION

Figure 1:
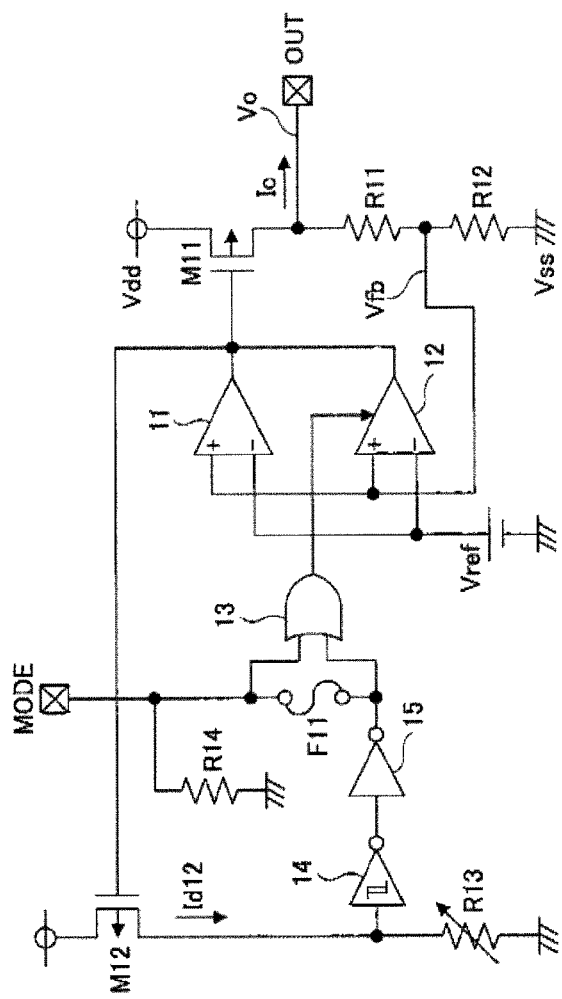
FIG. 1 is a circuit diagram showing a constant voltage circuit according to a first embodiment of the present invention.

Referring to the drawings, embodiments of the present invention are described in detail.

First Embodiment

FIG. 1 is a circuit diagram showing a constant voltage circuit according to a first embodiment of the present invention. When the constant voltage circuit according to the first embodiment of the present invention is compared with the conventional constant voltage circuit shown in FIG. 3, the constant voltage circuit according to the first embodiment of the present invention includes a trimming fuse F11 between a first input terminal and a second input terminal of an OR circuit 13. Since the operations of the constant voltage circuit have been described above in the BACKGROUND ART, operations of the trimming fuse F11 is mainly described.

Figure 3:
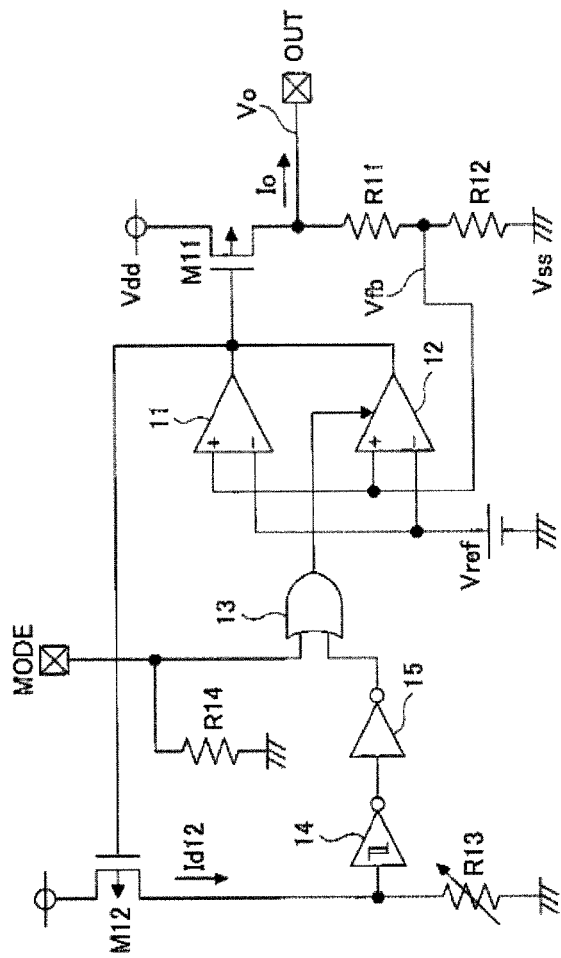
FIG. 3 is a circuit diagram showing a conventional constant voltage circuit.

In addition, in FIG. 1, when an element is similar or the same as that shown in FIG. 3, the same reference number (sign) as that shown in FIG. 3 is used for the element.

In a case where an output current Io is tested when an operating mode is switched between an energy saving operating mode and a normal operating mode, no signal is input to a mode selection pad MODE and a voltmeter is connected to the mode selection pad MODE, and the output current Io is increased or decreased.

A switching signal generating circuit is formed of a PMOS transistor M12, a resistor R13, and inverters 14 and 15. An output from the inverter 15, which is an output from the switching signal generating circuit and is an internal switching signal, is input to the mode selection pad MODE via the trimming fuse F11. Therefore, the switching of the operating mode can be detected by measuring a voltage of the mode selection pad MODE. Further, since a voltage change of the mode selection pad MODE is a logic level, the voltage change can be surely measured by a low-cost voltmeter. Consequently, the output current Io when the operating mode is switched can be accurately measured, and a trimming amount of the resistor R13 for determining a value of the output current Io which switches the operating mode can be accurately calculated.

In a case where it is confirmed that the output current Io becomes a predetermined value at switching the operating mode by trimming the resistance value of the resistor R13 (operating as a trimming unit to adjust a switching condition of the operating mode between the normal operating mode and the energy saving operating mode), the trimming fuse F11 is cut off by radiating a laser beam and so on After cutting off the trimming fuse F11, the constant voltage circuit of the present embodiment becomes the same as the conventional constant voltage circuit shown in FIG. 3; therefore, the operating mode can be selected by a signal from the mode selection pad MODE. That is, when no signal is input to the mode selection pad MODE or an external switching signal input to the mode selection pad MODE is a low level, an automatic switching mode is selected corresponding to an internal switching signal in which the energy saving operating mode and the normal operating mode is automatically switched, and when the external switching signal is a high level, the normal switching mode is selected regardless of the state of the internal switching signal.

As described above, according to the first embodiment of the present invention, the switching between the normal operating mode and the energy saving operating mode can be tested as a signal of the logic level from the mode selection pad MODE. Therefore, the value of the output current Io can be accurately measured when the operating mode is switched. Consequently, the resistance value of the resistor R13 can be accurately determined by trimming, and the value of the output current Io when the operating mode is switched can be accurately determined. Further, since the low-cost testing instrument can be used, the cost in the manufacturing processes can be reduced.

Second Embodiment

Figure 2:
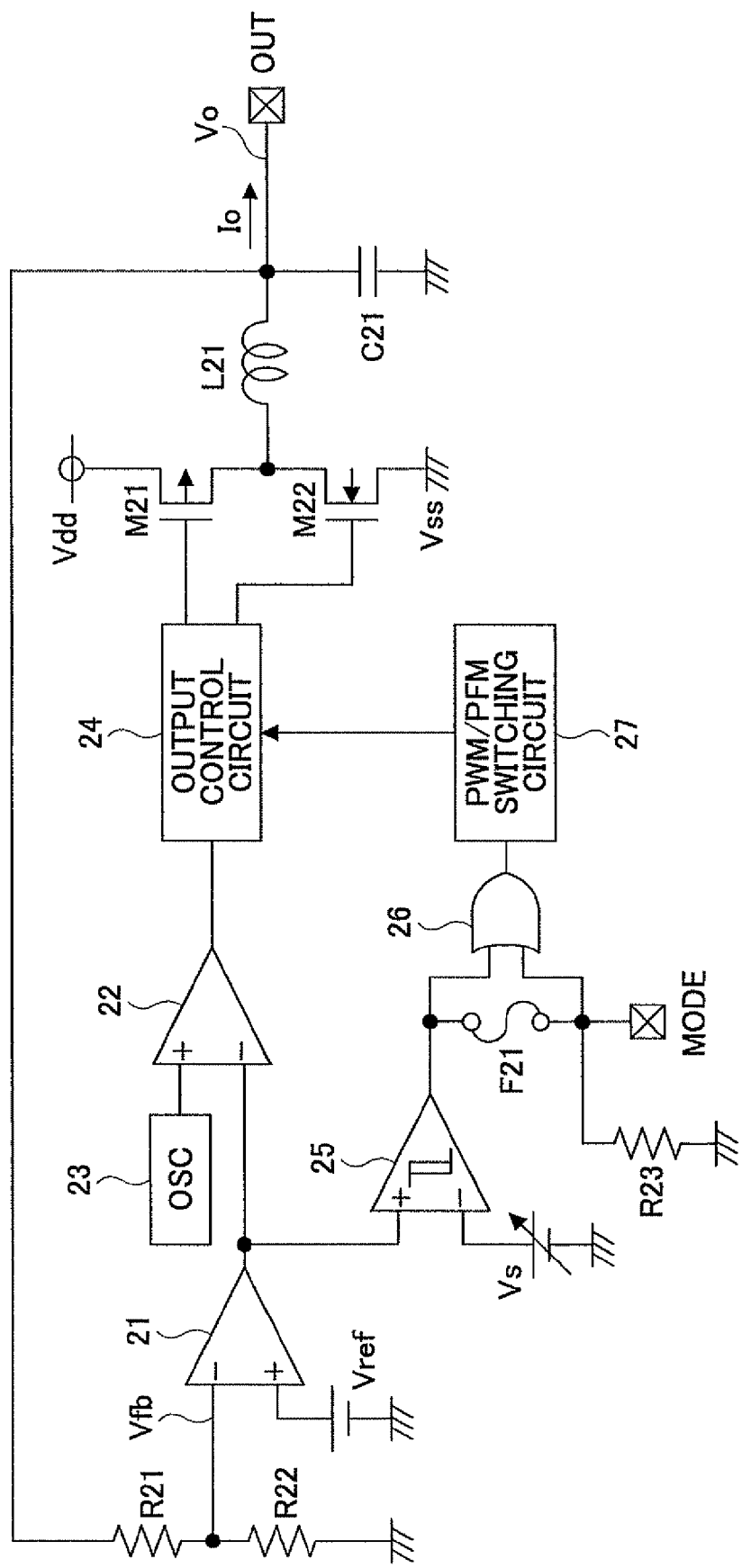
FIG. 2 is a circuit diagram showing a switching regulator circuit according to a second embodiment of the present invention.

FIG. 2 is a circuit diagram showing a switching regulator circuit according to a second embodiment of the present invention. The switching regulator circuit provides a PWM (pulse width modulation) operating mode in a PWM system, and a PFM (pulse frequency modulation) operating mode in a PFM system.

In the PWM operating mode, ON and OFF of a switching transistor M21 are repeated with a predetermined cycle, and an ON time of the switching transistor M21 is controlled corresponding to a change of an output voltage Vo. In the PWM system, a switching loss becomes large; however, a high-speed response can be performed, and a power source efficiency can be maintained to be high when an output current Io is large.

In the PFM operating mode, the output voltage Vo is caused to be stable by changing a frequency which controls ON and OFF of the switching transistor M21. In the present embodiment, the ON cycle during the PWM operating mode is made to be arbitrarily intermittent, and the PFM system is performed. Since the number of the ON and OFF times of the switching transistor M21 is decreased, the switching loss generated at the ON/OFF time can be decreased, and the power source efficiency can be increased even if the output current Io is small; however, a response speed becomes slow when a load is changed.

As shown in FIG. 2, the switching regulator circuit according to the second embodiment of the present invention includes a reference voltage source Vref, an error amplifying circuit 21, a PWM comparator 22, an oscillating circuit 23 (OSC), an output control circuit 24, the switching transistor M21, a synchronous rectification transistor M22, an inductor L21, an output capacitor C21, resistors R21, R22, and R23, a comparator 25, a voltage source Vs (current determining voltage source), an OR circuit 26, a PWM/PFM switching circuit 27, a trimming fuse F21, a power source terminal Vdd, a ground potential terminal Vss, an output terminal OUT, and a mode selection pad MODE.

A voltage of the reference voltage source Vref is input to a non-inverting input terminal of the error amplifying circuit 21, and a voltage Vfb in which an output voltage Vo is divided by the resistors R21 and R22 is input to an inverting input terminal of the error amplifying circuit 21.

An output from the error amplifying circuit 21 is input to an inverting input terminal of the PWM comparator 22 and to a non-inverting input terminal of the comparator 25. A triangular pulse signal output from the OSC 23 is input to a non-inverting input terminal of the PWM comparator 22. An output from the PWM comparator 22 is input to the output control circuit 24. The output control circuit 24 outputs a gate control signal to the switching transistor M21 and the synchronous rectification transistor M22.

The switching transistor M21 is a PMOS transistor whose source is connected to the power source terminal Vdd and whose drain is connected to a connection point of the drain of the synchronous rectification transistor M22 which is an NMOS transistor with one end of the inductor L21. The source of the synchronous rectification transistor M22 is connected to the ground potential terminal Vss.

The other end of the inductor L21 is connected to the output terminal OUT. The output capacitor C21 is connected between the output terminal OUT and the ground potential terminal Vss. The comparator 25 and the voltage source Vs form a switching signal generating circuit. A voltage of the voltage source Vs is applied to an inverting input terminal of the comparator 25. The comparator 25 outputs an internal switching signal and the internal switching signal is input to a first input terminal of the OR circuit 26.

A second input terminal of the OR circuit 26 is connected to the mode selection pad MODE and is also grounded via the resistor R23. Therefore, when no signal is input to the mode selection pad MODE, the mode selection pad MODE is in a low level. Further, the trimming fuse F21 is connected between the first and second input terminals of the OR circuit 26. An output from the OR circuit 26 is input to the PWM/PFM switching circuit 27. An output from the PWM/PFM switching circuit 27 is input to the output control circuit 24.

Next, operations of the switching regulator circuit shown in FIG. 2 are described. First, a case is described. In this case, the trimming fuse F21 has not been cut off. In this state, an external signal has not been input to the mode selection pad MODE. The error amplifying circuit 21 amplifies a difference voltage between the voltage from the reference voltage source Vref and the voltage Vfb obtained by dividing the output voltage Vout with the use of the resistors R21 and R22. The PWM comparator 22 compares a voltage output from the error amplifying circuit 21 with the voltage of the triangular pulse signal output from the OSC 23, and outputs a pulse signal having a pulse width corresponding to the output voltage from the error amplifying circuit 21. The output control circuit 24 outputs a control signal for complementarily switching ON/OFF the switching transistor M21 and the synchronous rectification transistor M22 corresponding to the input pulse signal.

When the switching transistor M21 is ON and the synchronous rectification transistor M22 is OFF, electric power is supplied to a load circuit (not shown) connected to the output terminal OUT, and also energy is stored in the inductor L21 and the output capacitor C21. When the switching transistor M21 is OFF and the synchronous rectification transistor M22 is ON, the energy stored in the inductor L21 and the output capacitor C21 is supplied to the load circuit.

The comparator 25 compares the voltage output from the error amplifying circuit 21 with the voltage from the voltage source Vs. The voltage output from the error amplifying circuit 21 is decreased when the output voltage Vo of the switching regulator circuit is high, and is increased when the output voltage Vo of the switching regulator circuit is low. When the output current Io is small, since the output voltage Vo of the switching regulator circuit is high, the voltage output from the error amplifying circuit 21 is decreased. When voltage output from the error amplifying circuit 21 is the voltage of the voltage source Vs or less, the output from the comparator 25 is a low level. When the output current Io is increased, the output voltage Vo of the switching regulator circuit is decreased; therefore, the voltage output from the error amplifying circuit 21 is increased. When the voltage output from the error amplifying circuit 21 rises above the voltage of the voltage source Vs, the output from the comparator 25 becomes a high level by being inverted.

An internal switching signal output from the comparator 25 is input to the PWM/PFM switching circuit 27 via the OR circuit 26. When the input signal to the PWM/PFM switching circuit 27 is a low level, the PWM/PFM switching circuit 27 outputs a switching signal to the output control circuit 24 so that the output control circuit 24 performs PWM control; and when the input signal to the PWM/PFM switching circuit 27 is a high level, the PWM/PFM switching circuit 27 outputs a switching signal to the output control circuit 24 so that the output control circuit 24 performs PFM control.

That is, when the output current Io is lower than a predetermined current value and the output signal from the comparator 25 is a low level, the output control circuit 24 performs switching by a PWM operating mode; and when the output current Io becomes the predetermined current value or more, the output signal from the comparator 25 becomes a high level, and the output control circuit 24 performs switching by a PFM operating mode.

In addition, the internal switching signal (the output signal from the comparator 25) is also input to the mode selection pad MODE via the trimming fuse F21; therefore, when the voltage of the mode selection pad MODE is obtained, the state of the internal switching signal can be obtained.

That is, in a test of a semiconductor device, in a case where the output current Io is measured when the operating mode of the switching regulator circuit is switched, a voltmeter connected to the mode selection pad MODE obtains that the voltage of the mode selection pad MODE is changed in a logic level. With this, the output current Io can be accurately measured.

In the second embodiment of the present invention, in order to accurately determine the current value of the output current Io when the operating mode is switched between the PWM operating mode and the PFM operating mode, it is determined that the voltage of the voltage source Vs (operating as a trimming unit to adjust a switching condition of the operating mode between the PWM operating mode and the PFM operating mode) can be changed by trimming. After changing the voltage of the voltage source Vs by the trimming, when the measured current value of the output current Io is within a predetermined value, the trimming fuse F21 is cut off similar to the case in the first embodiment of the present invention.

After cutting off the trimming fuse F21, the operating mode can be selected by a level of an external switching signal input to the mode selection pad MODE. That is, when an external switching signal of a high level is input, the PWM operating mode can be selected regardless of the internal switching signal output from the comparator 25. In addition, when an external switching signal of a low level is input or an external switching signal is not input, an automatic switching mode is selected in which the operating mode is automatically switched between the PWM operating mode and the PFM operating mode corresponding to the internal switching signal.

The voltage input to the comparator 25 is a hysteresis voltage. Consequently, the voltage output from the error amplifying circuit 21 when the operating mode is switched from the PFM operating mode to the PWM operating mode is determined to be higher than the voltage output from the error amplifying circuit 21 when the operating mode is switched from the PWM operating mode to the PFM operating mode. With this, jitter is prevented when the operating mode is switched.

As described above, according to the second embodiment of the present invention, in a test of a semiconductor device, a switched result between the PWM operating mode and the PFM operating mode can be tested as a logic level signal by obtaining a voltage at the mode selection pad MODE. Therefore, the current value of the output current Io can be accurately measured when the operating mode is switched. As a result, adjustment of the voltage of the voltage source Vs by trimming can be accurately performed in which the output current Io is determined when the operating mode is switched. In addition, a low-cost voltmeter can be used when a voltage at the mode selection pad MODE is measured; therefore, the cost in the manufacturing processes can be reduced.

Further, the present invention is not limited to the embodiments, but various variations and modifications may be made without departing from the scope of the present invention.

The present invention is based on Japanese Priority Patent Application No. 2008-004146 filed on Jan. 11, 2008, with the Japanese Patent Office, the entire contents of which are hereby incorporated herein by reference.

The invention claimed is:

1. A semiconductor device having a first operating mode and a second operating mode, the semiconductor device comprising:
 a switching signal generating circuit which outputs an internal switching signal for switching an operating mode between the first operating mode and the second operating mode when an operating state satisfies a predetermined condition;

a mode selection pad to which an external switching signal is input;

a trimming fuse which inputs an output from the switching signal generating circuit to the mode selection pad; and a switching circuit which switches the operating mode between the first operating mode and the second operating mode after cutting off the trimming fuse, wherein when the external switching signal is a high level, the switching circuit selects the first operating mode, and when the external switching signal is a low level or not input, the switching circuit selects an automatic switching mode in which the operating mode is automatically switched between the first operating mode and the second operating mode, corresponding to the internal switching signal, and wherein the mode selection pad is configured for monitoring the switching signal before cutting off the trimming fuse, and is configured for selecting the operation mode after cutting off the trimming fuse.

2. The semiconductor device as claimed in claim 1, wherein:

the semiconductor device is a constant voltage circuit having a normal operating mode as the first operating mode and an energy saving operating mode as the second operating mode; and the constant voltage circuit includes
a current detecting circuit which detects whether a current output from the constant voltage circuit has a predetermined value or more; wherein
the switching signal generating circuit outputs an internal switching signal for switching the operating mode between the normal operating mode and the energy saving operating mode based on a signal output from the current detecting circuit.

3. The semiconductor device as claimed in claim 1, wherein:

the semiconductor device is a switching regulator circuit having a PWM operating mode as the first operating mode and a PFM operating mode as the second operating mode; and the switching regulator circuit includes
a current detecting circuit which detects whether a current output from the switching regulator circuit has a predetermined value or more; wherein
the switching signal generating circuit outputs an internal switching signal for switching the operating mode between the PWM operating mode and the PFM operating mode based on a signal output from the current detecting circuit.

4. The semiconductor device as claimed in claim 1, further comprising:

a trimming unit wherein a switching condition of the operating mode between the first operating mode and the second operating mode is adjusted by trimming the trimming unit.

5. The semiconductor device as claimed in claim 2, further comprising:

a trimming unit wherein a switching condition of the operating mode between the normal operating mode and the energy saving operating mode is adjusted by trimming the trimming unit.

6. The semiconductor device as claimed in claim 3, further comprising:

a trimming unit wherein a switching condition of the operating mode between the PWM operating mode and the PFM operating mode is adjusted by trimming the trimming unit.

7. A manufacturing method of the semiconductor device as claimed in claim 1, the method comprising:

inputting an output from the switching signal generating circuit to the mode selection pad via the trimming fuse; and testing a state of the internal switching signal at the mode selection pad.

8. The manufacturing method of the semiconductor device as claimed in claim 7, further comprising:

cutting off the trimming fuse after testing the state of the internal switching signal.

9. The manufacturing method of the semiconductor device as claimed in claim 7, further comprising:

trimming a trimming unit of the semiconductor device to adjust a switching condition of the operating mode between the first operating mode and the second operating mode.

10. The manufacturing method of the semiconductor device as claimed in claim 9, further comprising:

cutting off the trimming fuse after trimming the trimming unit.

11. The semiconductor device as claimed in claim 1, wherein in a case that the trimming fuse has been cut off, the switching circuit, when the external switching signal is received through the mode selection pad, switches the operating mode to the first operating mode, regardless of a state of the internal switching signal.

12. An electronic device including a switching regulator circuit having a first operating mode and a second operating mode, the switching regulator circuit comprising:

a switching signal generating circuit which outputs an internal switching signal for switching an operating mode between the first operating mode and the second operating mode when an operating state satisfies a predetermined condition;

a mode selection pad to which an external switching signal is input;

a trimming fuse which inputs an output from the switching signal generating circuit to the mode selection pad; and a switching circuit which switches the operating mode between the first operating mode and the second operating mode after cutting off the trimming fuse, wherein when the external switching signal is a high level, the switching circuit selects the first operating mode, and when the external switching signal is a low level or not input, the switching circuit selects an automatic switching mode in which the operating mode is automatically switched between the first operating mode and the second operating mode, corresponding to the internal switching signal, and wherein the mode selection pad is configured for monitoring the switching signal before cutting off the trimming fuse, and is configured for selecting the operation mode after cutting off the trimming fuse.

* * * * *